United States Patent
Xu et al.

(10) Patent No.: US 6,461,902 B1
(45) Date of Patent: Oct. 8, 2002

(54) RF LDMOS ON PARTIAL SOI SUBSTRATE

(75) Inventors: Shuming Xu, Santa Clara, CA (US); Hanhua Feng; Pang-Dow Foo, both of Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 09/618,263

(22) Filed: Jul. 18, 2000

(51) Int. Cl.[7] .......................... H01L 21/00; H01L 21/84
(52) U.S. Cl. ....................... 438/163; 438/286; 438/296; 438/307; 438/923
(58) Field of Search ................................ 438/163, 286, 438/296, 307, 923, FOR 188

(56) References Cited

U.S. PATENT DOCUMENTS

| | | | |
|---|---|---|---|
| 4,683,637 A | * | 8/1987 | Varker et al. |
| 5,378,912 A | | 1/1995 | Pein .......................... 257/335 |
| 5,382,818 A | | 1/1995 | Pein .......................... 257/347 |
| 5,554,546 A | | 9/1996 | Malhi ........................ 437/40 |
| 5,567,629 A | * | 10/1996 | Kubo |
| 5,650,354 A | | 7/1997 | Himi et al. .................. 437/63 |
| 5,693,975 A | * | 12/1997 | Lien |
| 5,777,365 A | | 7/1998 | Yamaguchi et al. ........ 257/347 |
| 5,795,800 A | * | 8/1998 | Chan et al. |
| 5,930,642 A | | 7/1999 | Moore et al. ............... 438/407 |

FOREIGN PATENT DOCUMENTS

WO    WO-9320587 A1  * 10/1993

* cited by examiner

*Primary Examiner*—George Fourson
*Assistant Examiner*—Michelle Estrada

(57) ABSTRACT

In the prior art LDMOSFET devices capable of handling high power have been made by locating the source contact on the bottom surface of the device, allowing for good heat sinking, with connection to the source region being made through a sinker. However, this structure has poor high frequency characteristics. Also in the prior art, good high frequency performance has been achieved by introducing a dielectric layer immediately below the source/drain regions (SOI) but this structure has poor handling capabilities. The present invention achieves both good high frequency behavior as well as good power capability in the same device. Instead of inserting a dielectric layer over the entire cross-section of the device, the dielectric layer is limited to being below the heavily doped section of the drain with a small amount of overlap into the lightly doped section. The structure is described in detail together with a process for manufacturing it.

7 Claims, 5 Drawing Sheets

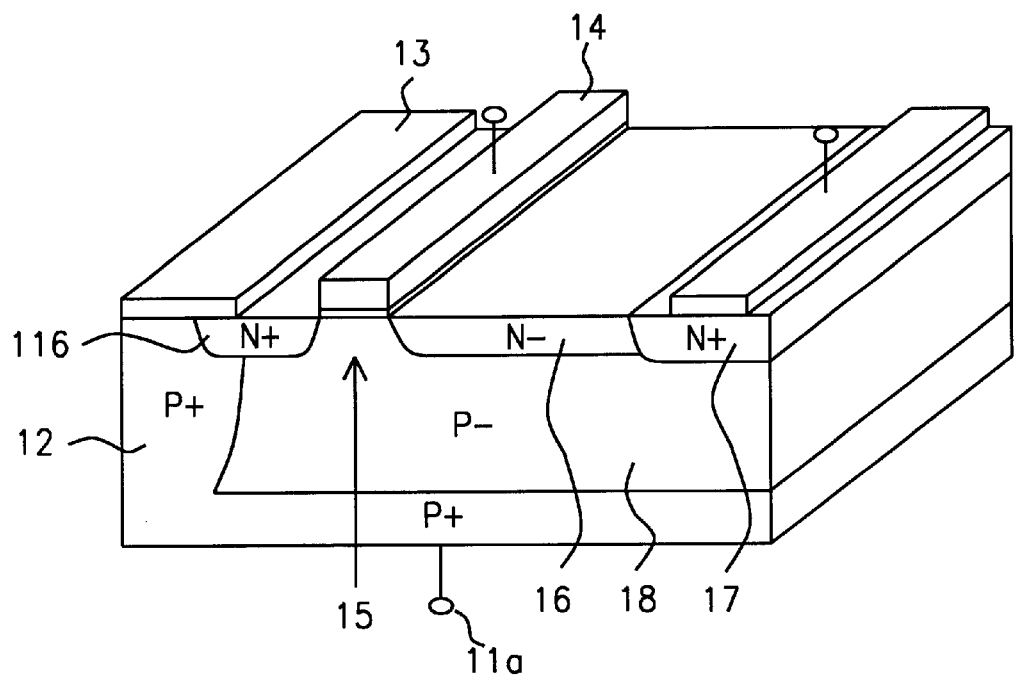
FIG. 1 – Prior Art
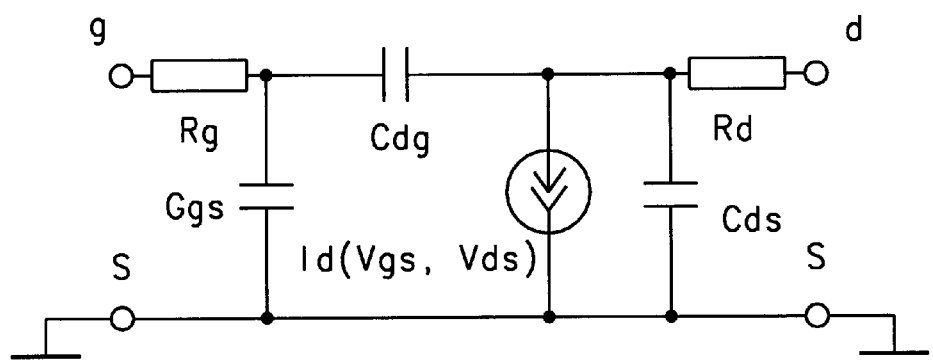
FIG. 2 – Prior Art

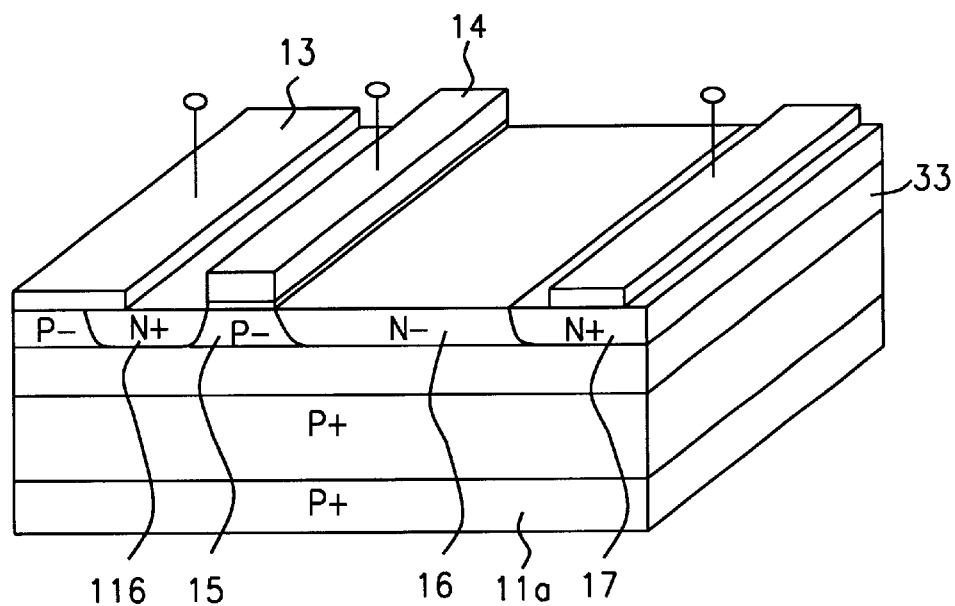
FIG. 3 – Prior Art
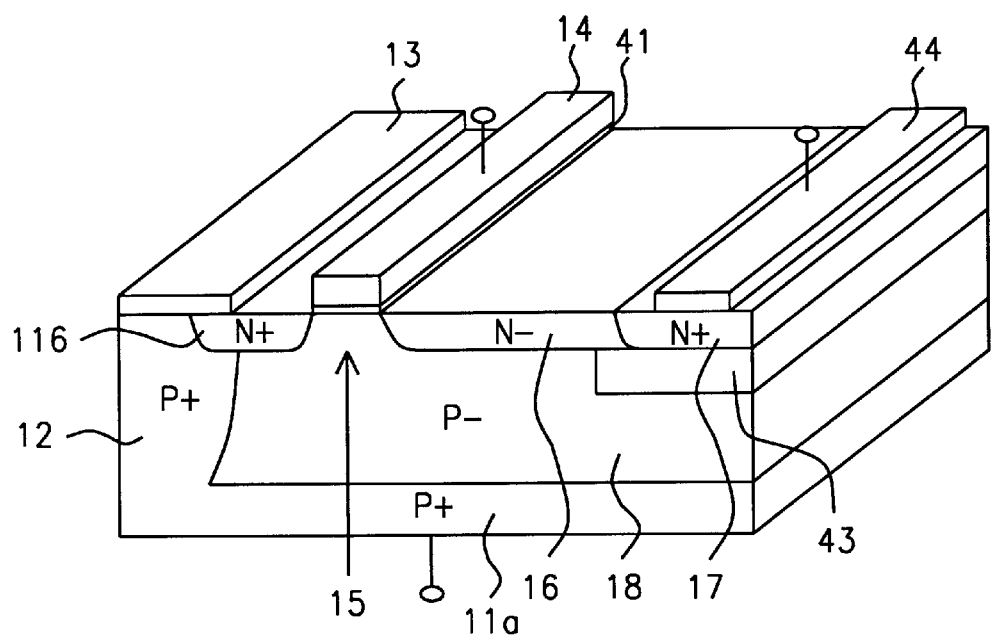
FIG. 4

RF LDMOS ON PARTIAL SOI SUBSTRATE

FIELD OF THE INVENTION

The invention relates to the general field of MOSFETs with particular reference to LDD MOSFETs and with added emphasis on improving power and frequency behavior.

BACKGROUND OF THE INVENTION

In its most general form, a field effect transistor (FET), located at an active region, consists of a semiconductor substrate (usually silicon) on which is grown a thin layer of insulating oxide ($SiO_2$). A conducting layer (a metal or heavily doped polysilicon) called the gate electrode is deposited on top of the oxide. Two heavily doped regions called the source and the drain are formed in the substrate on either side of the gate. The source-to-drain electrodes are equivalent to two PN junctions back to back. This region between the source and drain regions is called the channel region. The gate electrode can control the flow of current from source to drain by varying the amount of charge present in the channel region.

When power is not a concern, the most economic layout for FETs is for source, gate, and drain to all lie in the same plane. When the device is required to operate at high power, means must be found for dissipating the generated heat, particularly at the source. To accomplish this, the design illustrated in FIG. 1 has been widely adopted in the industry. In this design, connection to the source is made through lower area 11a which occupies the entire bottom of the device, where it can be directly connected to a heat sink. Lower area 11a is connected to source 11b through sinker 12. Both 11a and 12 are of P+ silicon because P– region 18n needs to be grounded and metallic shorting bar 13 is provided in order to connect 11b to 12. The remainder of the device is of a standard nature. Gate 14 controls the current flow in the body of the device 18, across channel region 15, into the drain which is made up of an inner, lightly doped section 16 and an outer, heavily doped section 17.

FIG. 2 shows the equivalent circuit of the design seen in FIG. 1. In addition to the series resistance $R_a$ and $R_d$ associated with the source and drain respectively, three parasitic capacitances can also be seen. These are the source-gate capacitance $C_{ge}$, the drain-gate capacitance $C_{dg}$, and the source-drain capacitance $C_{de}$. Of these, $C_{de}$ is the largest and most important in terms of determining frequency response of the device.

Unfortunately, $C_{de}$ is large in designs of the type shown in FIG. 1 because of the relatively thin depletion layer that forms at the N+/P– interface. One approach that has been used to overcome this problem has been the design illustrated in FIG. 3. Here, dielectric layer 33 is inserted between the source, drain and channel regions 11b, 16/17, and 15, respectively. This ensures that the magnitude of $C_{dg}$ will be determined by the thickness of 33 rather than by any depletion layers. While this approach is effective in greatly reducing $C_{de}$, it has the unfortunate side effect of blocking the flow of heat from the source area 11b down to the heat sinking area 11a. Thus, devices of the type shown in FIG. 3 are generally limited to operating at low power levels.

A routine search of the prior art was performed but no references that teach the exact processes and structures of the present invention were discovered. Several reference of interest were, however, encountered along the way. For example, in U.S. Pat. No. 5,554,546, Malhi shows a "partial SOI" LDMOS with oxide under the channel, drain and source. In U.S. Pat. No. 5,930,642, Moore et al. describe a LDMOS with oxide under the channel. In U.S. Pat. No. 5,650,354, Himi et al. show a SIO LDMOS without oxide under the Tx. Pein (U.S. Pat. No. 5,382,818), Pein (U.S. Pat. No. 5,378,912), and Yamaguchi et al. (U.S. Pat. No. 5,777,365) all show various LDMOS devices with different oxide layer configurations.

SUMMARY OF THE INVENTION

It has been an object of the present invention to provide a LDMOSFET design that has both good high performance characteristics and good power dissipation.

Another object of the invention has been to provide a method for manufacturing said improved LDMOSFET.

These objects have been achieved by using a partial SOI (silicon on insulator) approach. In the prior art LDMOSFET devices capable of handling high power have been made by locating the source contact on the bottom surface of the device, allowing for good heat sinking, with connection to the source region being made through a sinker, but this structure has poor high frequency characteristics. Also in the prior art, good high frequency performance has been achieved by introducing a dielectric layer immediately below the source/drain structure (SOI) but this structure has poor power handling capabilities. The present invention achieves both good high frequency behavior as well as good power capability in the same device. Instead of inserting a dielectric layer over the entire cross-section of the device, the dielectric layer is limited to being below the heavily doped section of the drain with a small amount of overlap of the lightly doped section. The structure is described in detail together with a process for manufacturing it.

BRIEF DESCRIPTION OF THE DRAWINGS

FIG. 1 shows one kind of LDMOSFET of the prior art.

FIG. 2 is the equivalent circuit for FIG. 1.

FIG. 3 shows a second kind of LDMOSFET of the prior art.

FIG. 4 shows an LDMOSFET according to the present invention.

DESCRIPTION OF THE PREFERRED EMBODIMENTS

Figure 5:
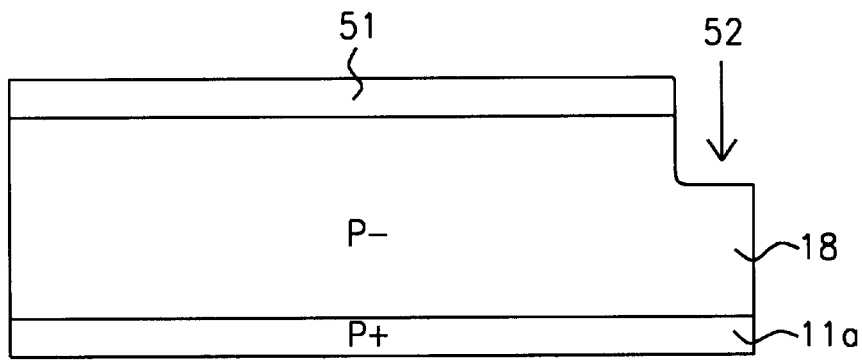
FIGS. 5–7 show several stages during the manufacture of the present invention.

The present invention shows a device that combines the best features of the devices seen in FIGS. 1 and 3, without suffering their disadvantages.

We refer now to FIG. 4. As before, lower area 11a, which is the external connection point for the source, can be directly mounted on a heat sink. It is connected to source 116 through sinker 12, and metallic shorting bar 13. Also as before, the remainder of the device is of a standard nature. Gate 14 controls the current flow across channel region 15 into the drain which is made up of an inner, lightly doped section 16 and an outer, heavily doped section 17.

As a key feature of the invention, representing a significant departure from the prior art, dielectric layer 43 is inserted between the drain region and the body of the device 18. Unlike the prior art device of FIG. 3, layer 43 underlies only the outer (N+) section 17 of the drain as well as just a small part of the inner (N−) section 16. The precise amount of inner section 16 that is underlaid by dielectric layer 43 is not important as long as all of outer section 17 is underlaid and most of 16 is not.

We now describe a process for manufacturing the device shown in FIG. 4. Referring to FIG. 5, the process begins with the provision of a body of P+ silicon 11a, typically a wafer, onto which layer 18 of P− silicon is epitaxially deposited.

The key novel step of forming dielectric layer 43 (FIG. 4) is now undertaken. Referring again to FIG. 5, oxide layer 51 is grown on the top surface of 18 and then patterned and etched to form a mask that defines trench 52 which runs parallel to the right edge of the figure (for this particular view), extending leftwards therefrom by between about 0.3 and 1.5 microns. Trench 52 is formed by etching all silicon that is not protected by the mask to a depth of between about 1 and 1.6 microns, giving the structure the appearance seen in FIG. 5.

Figure 6:
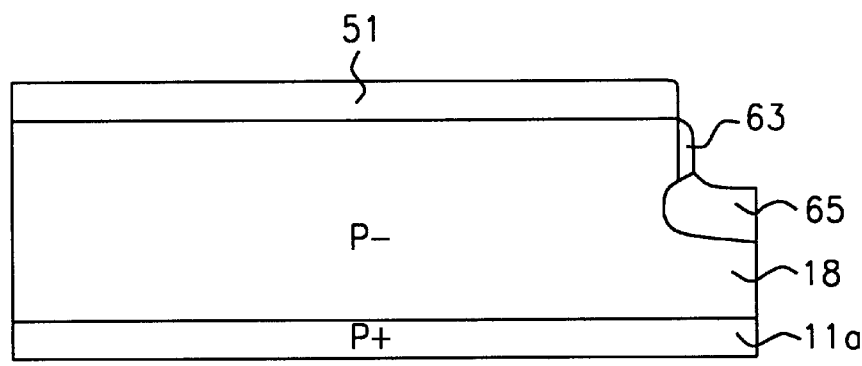

Referring now to FIG. 6, in the next step a layer of silicon nitride 63 is selectively deposited on all vertical sidewalls of trench 52 (to a thickness between about 1,350 and 1,650 Angstroms), generally by first depositing on all surfaces and then selectively removing it from the horizontal surfaces. That is silicon nitride is kept on the trench walls and removed from the bottom of the trench. With silicon nitride spacer 63 in place, all exposed silicon is oxidized to a depth of between about 0.45 and 0.55 microns by furnace for between about 65 and 75 minutes at a temperature between about 1,049 and 1,051° C., thereby forming oxide layer 65 at the bottom of trench 52. This gives the structure the appearance illustrated in FIG. 6.

Note that although we have described a specific process wherein the buried insulation layer is silicon oxide, it will be understood that other processes for placing other dielectric materials could also have been used without departing from the spirit of the invention.

Figure 7:
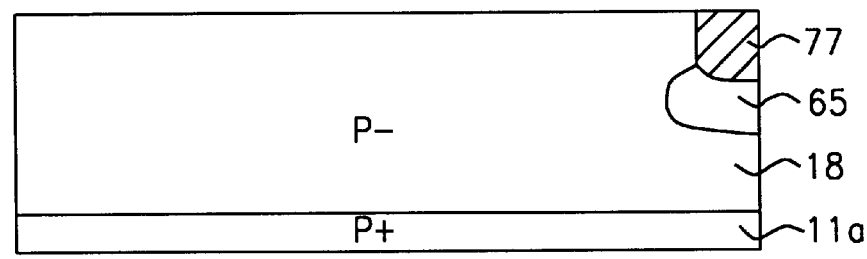

Referring now to FIG. 7, all silicon nitride is then removed and polysilicon 77 is deposited until trench 52 has been overfilled. This is followed by etching back the polysilicon until the oxide mask has been removed and the polysilicon's upper surface is coplanar (level) with the upper surface, as shown in the figure.

Conventional processing is then resumed. Referring once again to FIG. 4, sinker 12 of P+ silicon is formed by ion implantation through a mask followed by a drive-in heat treatment. It extends away from the left side (in this view) between about 4 and 10 microns, penetrating downwards to make contact with the P+ layer 11a. The lightly doped drain area 16 of N− silicon is formed by ion implantation. Its thickness is between about 1,500 and 3,500 Angstroms and it extends from the right side of the device to the right hand edge of the channel area 15. Then, heavily doped source and drain areas 116 and 17 are formed to a thickness is between about 2,500 and 3,500 Angstroms for the source and between about 6,500 and 8,500 Angstroms for the drain, also by ion implantation through a mask followed by thermal drive-in to ensure that the final thickness is sufficient for the heavily doped drain area 17 to extend as far as buried oxide layer 43. A gap for the channel area 15, of between about 0.6 and 1.5 microns, is left between the source and drain areas. The one finger width of the source region is between about 50 and 90 microns while the one finger width of the heavily doped drain section is between about 50 and 90 microns.

Gate oxide layer 41 is grown over the gap following which a metallic layer is deposited and then patterned and etched to form gate electrode 14, shorting layer 13 (that contact both the P+ sinker and source region), and drain electrode 44.

Figure 8B:
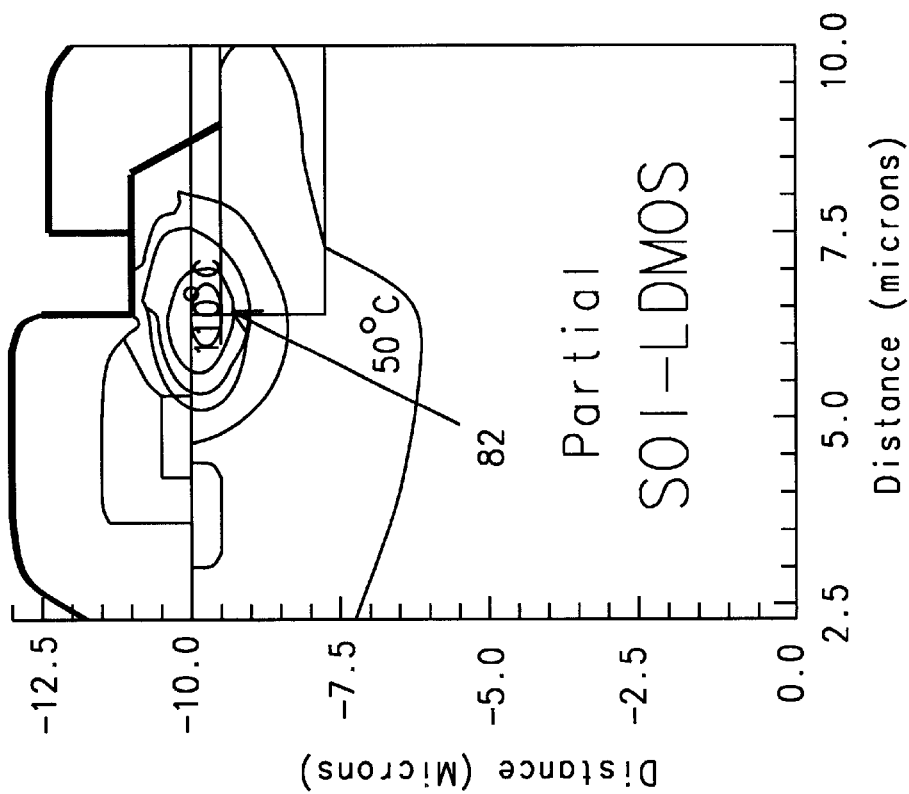
FIGS. 8a and 8b compare isotherms in a device of the prior art and in a device made according to the present invention, respectively.
Figure 8A:
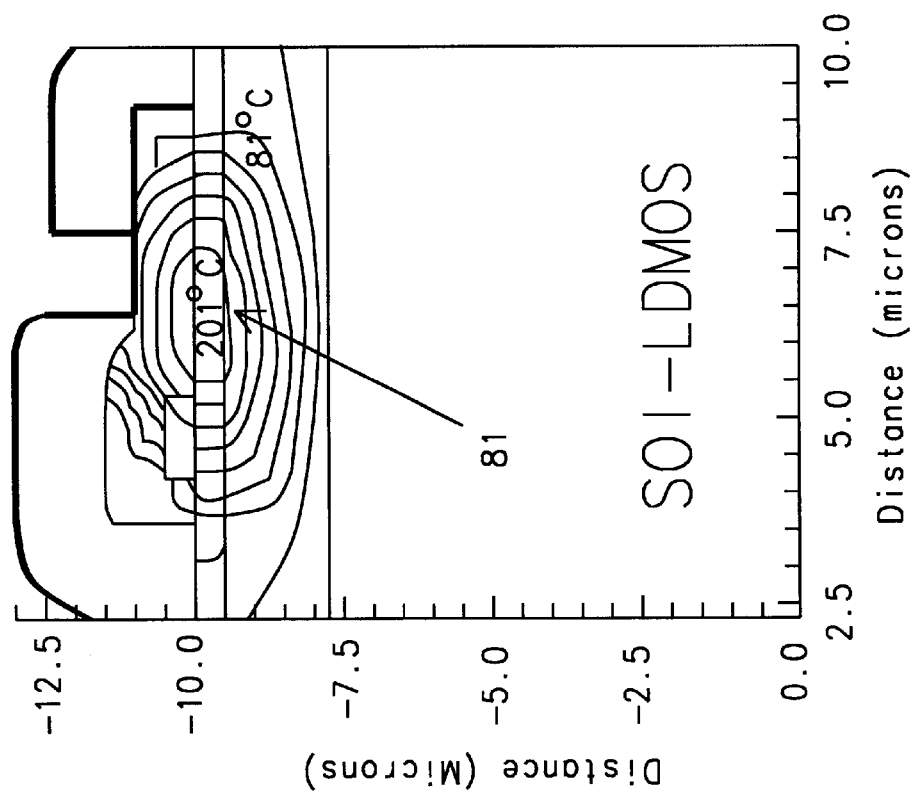

The effectiveness of the present invention can be seen in the data presented to the following two figures. The FIGS. 8a and 8b plots of isotherms (generated through simulation) are compared for a device of prior art design (SOI-LDMOS), such as shown in FIG. 3, and a device built according to the teachings of the present invention (Partial SOI-LDMOS) as shown in FIG. 4. In both cases, the isotherms center around an area located at the drain region. The voltage level at which both simulated devices were run was 20 volts. As can be seen by following arrows 81 and 82, the device of the prior art has a thermal dissipation capability such that when operating in this power range (between about 15 and 60 watts), the maximum inner temperature at equilibrium is between about 40 and 50° C. whereas for a device built according to the teachings of the present invention the equivalent maximum inner temperature at equilibrium was between about 80 and 90° C.

Figure 9:
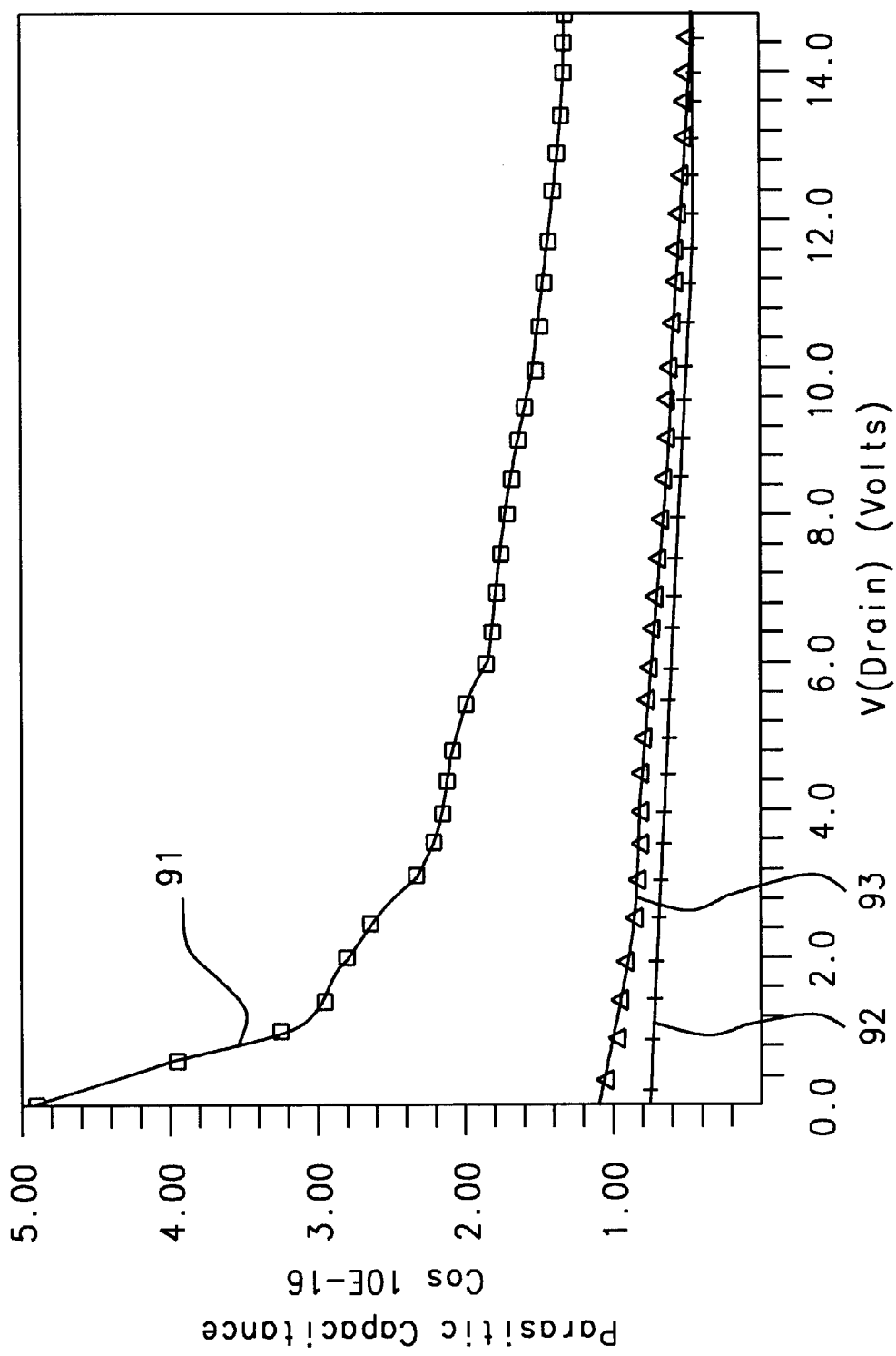
FIG. 9 plots parasitic capacitance as a function of drain voltage for two prior art devices and for the present invention.

FIG. 9 compares plots of the total parasitic capacitance (mainly due to $C_{ds}$) for several LDFET designs. Curve 91 is for the structure seen in FIG. 1, curve 92 is for the structure of FIG. 3, and curve 93 is for the structure of the present invention (FIG. 4). As can be seen, for low drain voltages curve 91 is about five times larger than that associated with the other structures and even for large applied voltages it remains about twice as large. On the other hand, there is very little difference at low voltages, and no difference at large voltages, between the SOI-LDMOS structure of the prior art and the Partial SOI-LDMOS structure of the present invention. Because of this, a field effect transistor having a cutoff frequency greater than about 7 Ghz can be made which is also capable of handling power levels up to about 60 watts.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing a field effect transistor, comprising:

providing a body of P+ silicon having left and right edges;

epitaxially depositing a layer of P− silicon, having a first upper surface, on the P+ silicon body;

forming a dielectric layer having a second upper surface that runs parallel to said first upper surface contiguous to the right edge and that extends away from the right edge by a first amount, said second upper surface being at a depth below said first upper surface;

then forming a sinker of P+ silicon contiguous to the left edge that extends away from the left edge by a second amount and downwards from said first upper surface into the P+ body;

forming a layer of N− silicon, having a thickness less than said depth, that extends away from the right edge by a third amount;

through a mask, forming first and second areas of a layer of N+ silicon that has a thickness equal to said depth, the first area extending away from the right edge for a first width that is less than said third amount and the second area being adjacent to, and extending away from, the sinker for a second width whereby a gap is left between the first and second N+ areas;

forming a layer of gate oxide over said gap and depositing a gate electrode over the gate oxide;

forming a layer of a conductive material on said first upper surface that contacts both the P+ sinker and the source region; and forming a drain electrode over the second N+ drain region.

2. The process of claim 1 wherein the step of forming the dielectric layer further comprises:

forming a layer of oxide on said first upper surface and then patterning and etching said oxide layer to form a mask that defines a trench running parallel to said right edge;

forming the trench by etching silicon unprotected by the mask down to said depth;

selectively depositing a layer of silicon nitride on all vertical sidewalls of said trench;

oxidizing all exposed silicon to a depth of between about 0.45 and 0.55 microns;

removing all silicon nitride;

depositing polysilicon until the trench has been overfilled; and etching back the polysilicon until the oxide mask has been removed and the polysilicon has an upper surface that is coplanar with said first upper surface.

3. The process of claim 2 wherein the step of oxidizing all exposed silicon further comprises furnace heating for between about 65 and 75 minutes at a temperature between about 1,049 and 1,051° C.

4. The process of claim 1 wherein said second amount that the sinker of P+ silicon extends away from the left edge is between about 4 and 10 microns.

5. The process of claim 1 wherein the depth below said first upper surface of the second upper surface is between about 8,000 and 9,000 Angstroms.

6. The process of claim 1 wherein said first amount that the dielectric layer extends away from the right edge is between about 11 and 12 microns.

7. The process of claim 1 wherein said third amount that the N− layer extends away from the right edge is between about 2 and 4.5 microns.

* * * * *

UNITED STATES PATENT AND TRADEMARK OFFICE
CERTIFICATE OF CORRECTION

PATENT NO. : 6,461,902 B1
DATED : October 8, 2002
INVENTOR(S) : Shuming Xu, Hanhua Feng and Pang-Dow Foo It is certified that error appears in the above-identified patent and that said Letters Patent is hereby corrected as shown below:

<u>Title page,</u>
Item [74], was completely omitted. Add -- George O. Saile; Stephen B. Ackerman --.

Signed and Sealed this

Fourth Day of February, 2003

JAMES E. ROGAN
*Director of the United States Patent and Trademark Office*